United States Patent
Babcock et al.

(10) Patent No.: US 7,572,708 B1
(45) Date of Patent: Aug. 11, 2009

(54) UTILIZATION OF DOPED GLASS ON THE SIDEWALL OF THE EMITTER WINDOW IN A BIPOLAR TRANSISTOR STRUCTURE

(75) Inventors: Jeff A. Babcock, Sunnyvale, CA (US);
Steve Adler, Cape Elizabeth, ME (US);
Todd Thiebeault, Gorham, ME (US);
Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/715,634

(22) Filed: Mar. 8, 2007

(51) Int. Cl.
*H01L 21/331* (2006.01)
(52) U.S. Cl. .............................. 438/369; 257/E21.149
(58) Field of Classification Search ................ 438/369, 438/202, 343, 309, 344, 345; 257/E21.379, 257/E29.184
See application file for complete search history.

(56) References Cited

U.S. PATENT DOCUMENTS 5,213,989 A * 5/1993 Fitch et al. .................. 438/365
6,734,073 B2 * 5/2004 Howard et al. .............. 438/341
2005/0098852 A1 5/2005 Kerr et al. .................... 257/539

FOREIGN PATENT DOCUMENTS

JP 05109744 A * 4/1993

* cited by examiner

*Primary Examiner*—W. David Coleman
*Assistant Examiner*—Shaka Scarlett
(74) *Attorney, Agent, or Firm*—Dergosits & Noah LLP

(57) ABSTRACT

A bipolar transistor device architecture and method of manufacture uses doped glass on the sidewall of the emitter window opening to reduce the emitter-base overlap capacitance while at the same time improving the polysilicon plugging effect. The doped glass sidewall also improves dopant loss in the oxide in the case in which an in-situ doped poly emitter is used. By using a doped sidewall glass, the sensitivity of dopant absorption that can potentially occur in un-doped spacers is removed. The proposed technique also provides a simple method for achieving narrow emitter window openings while simultaneously improving doping uniformity compared to implanted poly techniques. The technique also allows a self-aligned base to be performed, thereby allowing tighter spacing between the extrinsic base and the intrinsic base.

18 Claims, 3 Drawing Sheets

UTILIZATION OF DOPED GLASS ON THE SIDEWALL OF THE EMITTER WINDOW IN A BIPOLAR TRANSISTOR STRUCTURE

FIELD OF THE INVENTION

The present invention relates to semiconductor integrated circuit device structures and, in particular, to utilization of a doped glass on the sidewalls of the emitter window opening of a bipolar transistor structure to improve plugging effects.

DISCUSSION OF THE RELATED ART

Conventional bipolar transistor structures typically utilize an implanted polysilicon emitter or an in-situ doped polysilicon emitter. These bipolar emitter structures often suffer from a plugging effect that limits the uniformity of the dopant implanted in the polysilicon emitter and results in WE dependencies in the electrical parameters, such as beta (current gain), of the bipolar transistor.

The present invention provides a bipolar device architecture that reduces the emitter-base overlap capacitance while at the same time improving the polysilicon plugging effect. Use of doped glass as a solid diffusion source allows for better control of the dopant uniformity compared to implanted poly. The doped glass sidewall also improves dopant loss in the oxide for the case in which an in-situ doped poly emitter is used in bipolar technologies. By using a doped sidewall glass in the emitter architecture, such as phosphosilicate glass (PSG) for an NPN emitter or borosilicate glass (BSG) for a PNP emitter, the sensitivity of dopant absorption that can potentially occur in un-doped oxide spacers is removed. The proposed structure also allows a simple method for achieving narrow emitter window openings while simultaneously improving doping uniformity. The structure also allows a self-aligned extrinsic base to be performed, allowing tighter spacing between the extrinsic base and the intrinsic base. This technique also allows the total thermal budget to be reduced in advanced very narrow emitter width bipolar transistors, since it does not require significant thermals to drive the dopants out of the doped glass and into the emitter poly, particularly if combined with an implant into the emitter.

DETAILED DESCRIPTION OF THE INVENTION

FIGS. 1-7 illustrate fabrication steps typically utilized in a BiCMOS process flow for SiGe NPN transistors. Those skilled in the art will appreciate that the process steps shown in FIGS. 1-7 are only an example of an embodiment of an NPN process in accordance with the concepts of the present invention and are not to be considered as limiting the invention.

Figure 1:
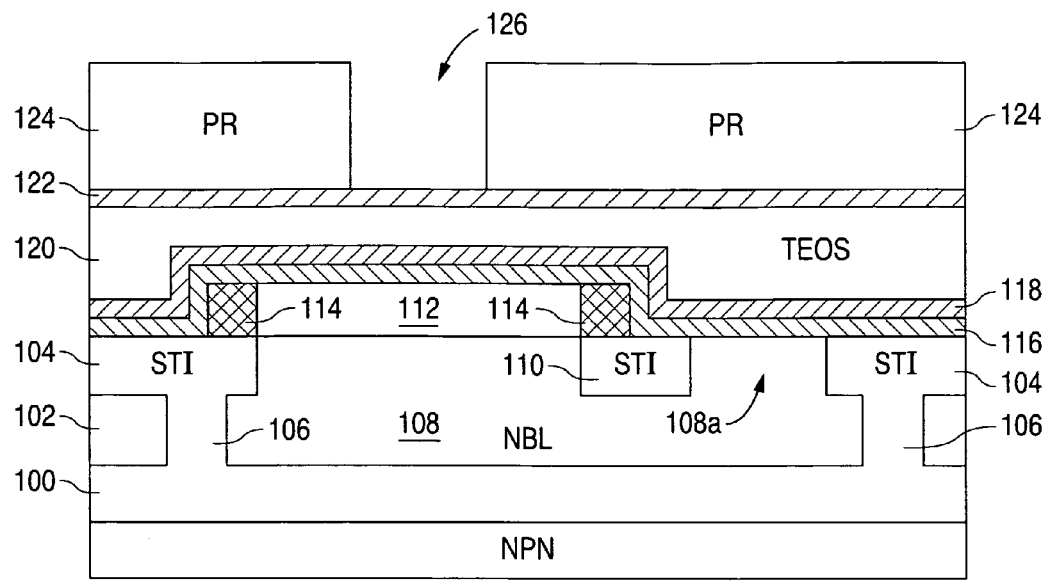
FIGS. 1-7 are partial cross-section drawings illustrating a sequence of process steps for fabricating an emitter structure in accordance with an illustrative embodiment of the present invention.

Standard processing for a bipolar transistor begins with formation of the epitaxial base with a TEOS/nitride layer deposited on the base. FIG. 1 shows a buried oxide layer 100 formed in a semiconductor substrate, represented by the designation "NPN" in FIG. 1. As stated above, in this embodiment, the semiconductor substrate comprises SiGe. A layer of epitaxial silicon 102 is formed on the buried oxide layer 100. Shallow trench isolation (STI) regions 104 are formed in the upper surface of the epitaxial layer 102 with deep trench isolation regions 106 extending down to the buried oxide layer 100 to define an isolated epi-layer active region "box" for formation of the NPN bipolar device. As shown in FIG. 1, the isolated epi "box" encloses an N-type buried layer (NBL) 108 that provides the collector region for the NPN device. Those skilled in the art will appreciate that the dopant profile for the N-type buried layer is chosen to be consistent with a particular device application. The N-type buried layer 108 includes a collector surface contact region 108a that is defined by shallow trench isolation (STI) region 110. The conductive intrinsic base region 112 and extrinsic base region 114 of the NPN device are defined over the collector region 108 and STI regions 110. A thin layer of silicon dioxide 116 is formed over the above-described structure and a thin layer if silicon nitride 118 is formed on the oxide layer 116.

Figure 2:
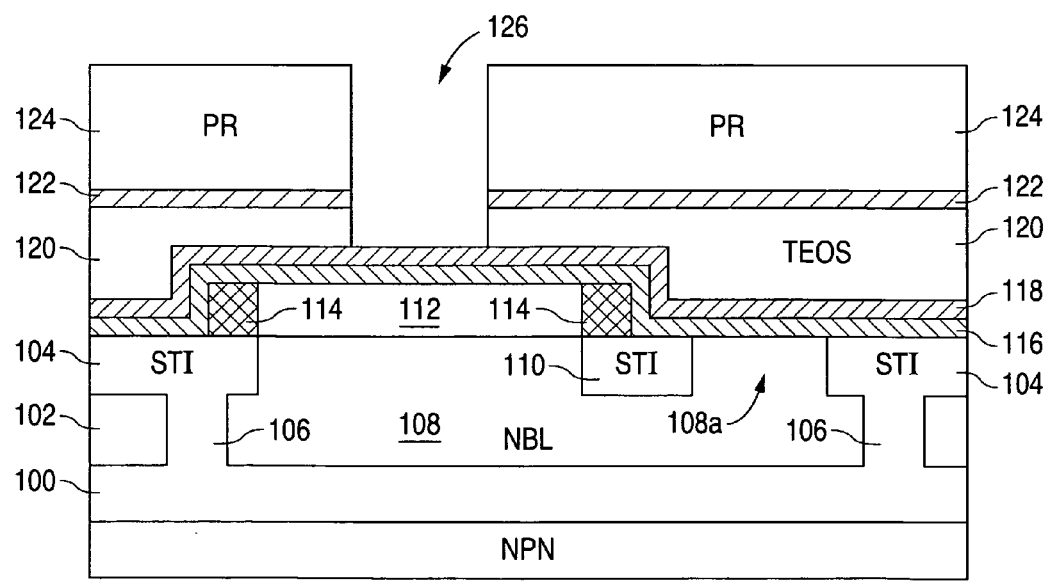
Figure 3:
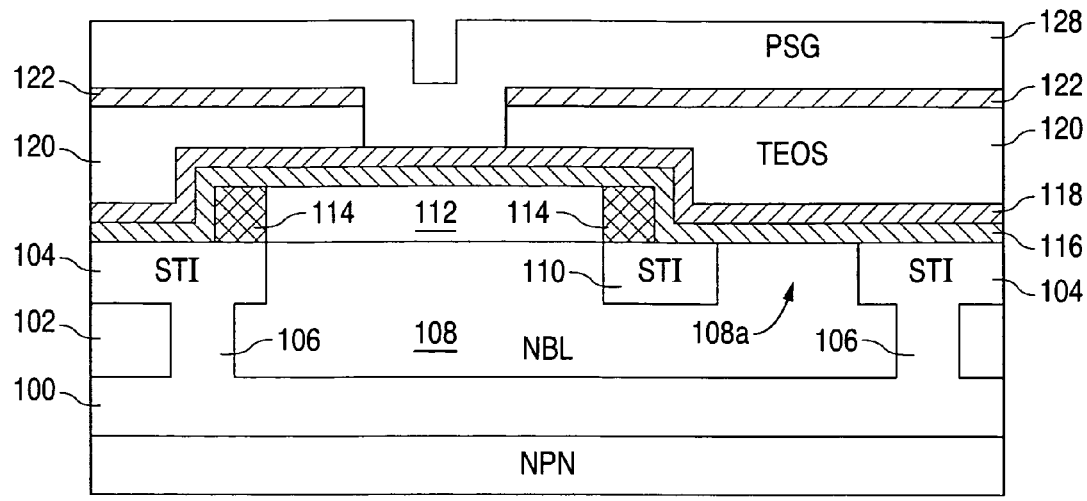

As further shown in FIG. 1, an embodiment of a process for forming a bipolar transistor emitter structure in accordance with the concepts of the present invention begins by depositing a thick TEOS layer 120 and a second silicon nitride layer 122. Photoresist (PR) 124 is then spun on and patterned in accordance with well known photolithographic techniques, resulting in the formation of an NPN emitter mask opening 126. The mask opening 126 is preferably formed have a width consistent with the minimum feature size (CD) that can be achieved with the process module in use. The mask opening 126 is then used to etch the nitride layer 122 and the TEOS layer 120 using well known etch techniques, stopping on the bottom nitride layer 118 as shown in FIG. 2. The photoresist mask 124 is then stripped and a layer of doped silicate glass 128, e.g., phosphosilicate glass (PSG) in the case of this NPN embodiment of the invention, is deposited as shown in FIG. 3 to fill the emitter window opening 126 and to contact the upper surface of the bottom nitride layer 118. The PSG should contain a high phosphorus concentration to act as a solid solubility limited diffusion source, typically on the order of 3-10 wt % phosphorus, preferably about 6 wt % phosphorous. Those skilled in the art will appreciate that the phosphorous concentration may be adjusted to achieve the desired emitter dopant diffusion goals.

Figure 4:
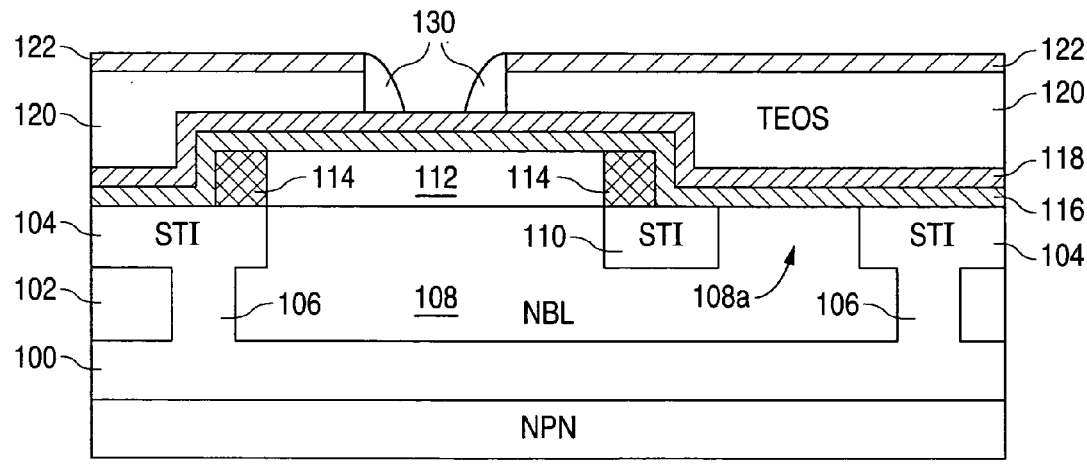

As shown in FIG. 4, doped PSG sidewall spacers 130 are then formed by performing a blanket etch of the PSG layer 128, stopping on the top nitride layer 122 and the bottom nitride layer 118. The use of the doped PSG spacers 130 allows achievement of emitter window openings smaller than the typical critical dimension (CD) control. As mentioned above, the PSG spacers 130 will serve as a dopant source for the poly emitter, the formation of which is discussed below. In high concentration PSG (>3 wt % phosphorous), the phosphorous is incorporated as P=O bonds or in a pentavalent structure $P_2O_5$ in $SiO_2$ atomic network. The solid state diffusion of phosphorous occurs when the film is heated at a temperature of 900° C. or greater and at which the P=O bonds are disassociated and the phosphorous diffuses out into the emitter poly. Emitter doping levels as high as 1E20 $cm^3$ can be achieved, depending upon the time and temperature of the annealing process. The rapid thermal anneal (RTA) normally used in advanced bipolar or BiCMOS processing to activate the implanted dopant atoms can thus act also as a diffusion driver, causing the doping species in the highly doped glass to diffuse out of the glass and into the poly emitter regions. Those skilled in the art will appreciate that optimization of the RTA or spike anneals can be done to provide best uniformity of the emitter dopant profile.

Figure 5:
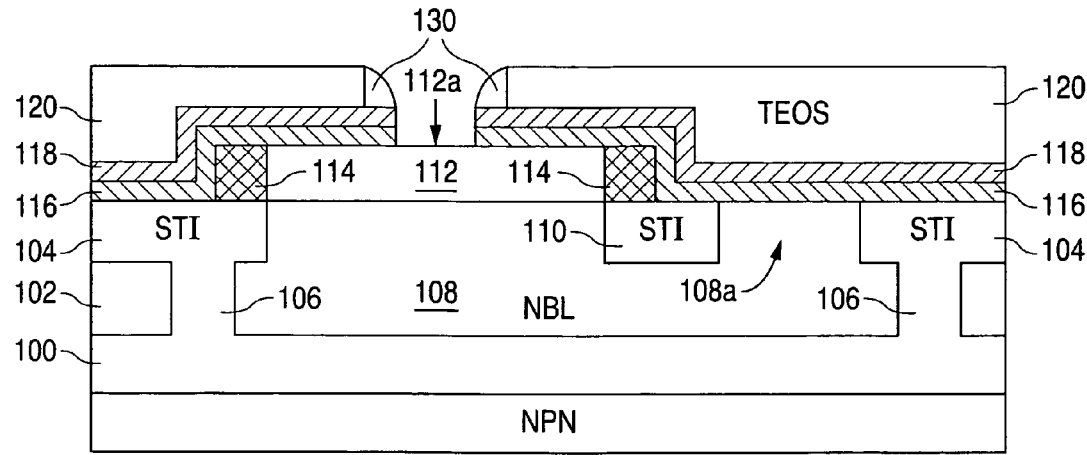

After formation of the PSG spacers 130, the emitter window is opened to the upper surface 112a of the intrinsic base region 112 through the use of a blanket etch of nitride layer 118 and a breakthrough etch of the oxide layer 116, as shown in FIG. 5.

Figure 6:
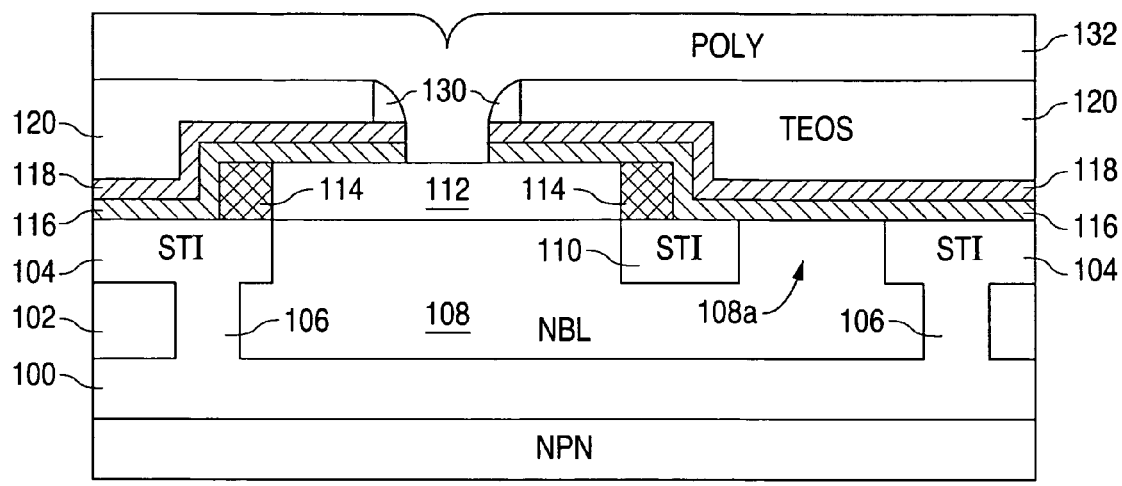

After cleaning the silicon surface 112a of the intrinsic base 112, a layer of emitter polysilicon 132 is deposited, as shown in FIG. 6.

Figure 7:
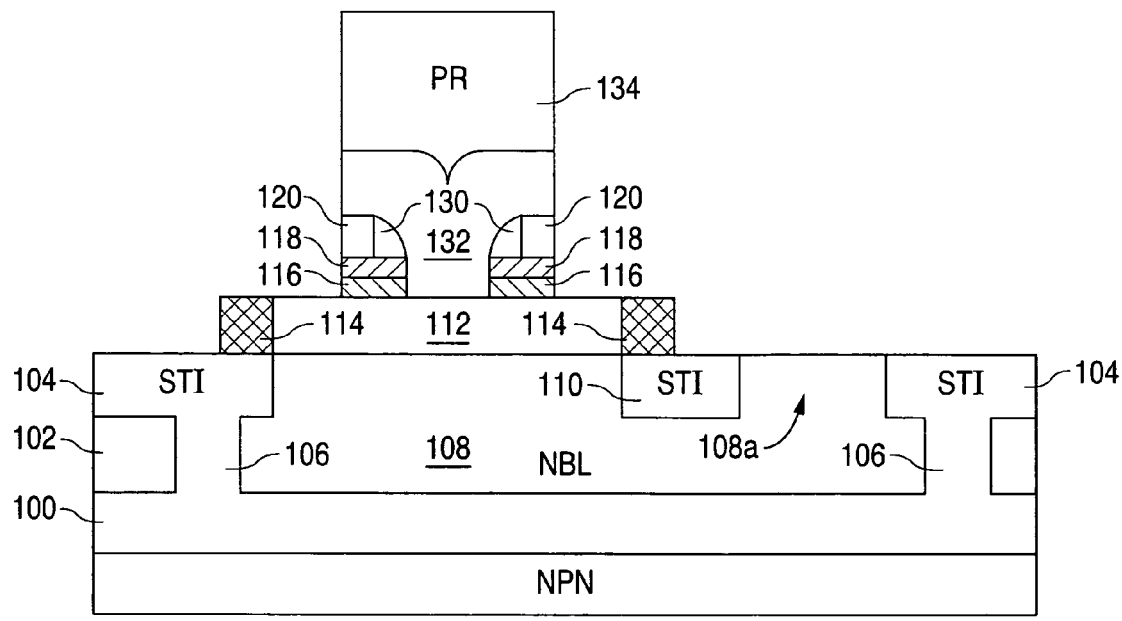

Next, a photoresist (PR) emitter poly mask 134 is formed and used to cut the emitter poly 132 and the TEOS/nitride/oxide stack, as shown in FIG. 7. At this point, the same mask 134 is used to block the intrinsic base 112 and the NPN emitter poly 132 while implanting the exposed extrinsic base regions 114.

As discussed above, an annealing step is then performed that causes phosphorous to diffuse from the PSG spacers 130 into the poly emitter 132.

The structure is then completed using a conventional process.

It should be understood that the particular embodiments of the invention described above have been provided by way of example and that other modifications may occur to those skilled in the art without departing from the scope and spirit of the invention as express in the appended claims and their equivalents.

What is claimed is:

1. A bipolar transistor structure comprising;
   a collector region formed in a semiconductor substrate, the collector region having a first conductivity type;
   a base region formed over the collector region, the base region having a second conductivity type that is opposite the first conductivity type;
   a first layer of dielectric material formed directly on an upper surface of the base region and having a first emitter window opening formed therein, the first emitter window opening defining sidewalls of the first layer of dielectric material that extend from an upper surface of the first layer of dielectric material to an upper surface of the base region to expose an upper surface area of the base region;
   a second layer of dielectric material formed on the first layer of dielectric material and having a second emitter window opening formed therein that is aligned with the first emitter window opening, the second emitter window opening defining sidewalls of the second layer of dielectric material that extend from an upper surface of the second layer of dielectric material to an upper surface of the first layer of dielectric material to expose a perimeter surface area of the first layer of dielectric material that extends around the perimeter of the first emitter window opening;
   doped silicate glass spacers formed on the sidewalls of the second layer of dielectric material and on the exposed perimeter surface area of the first layer of dielectric material and extending to a perimeter edge of the first emitter window opening; and
   a conductive emitter having the first conductivity type and formed to extend into the first and second emitter window openings and into contact with the doped silicate glass spacers, the sidewalls first layer of dielectric material and the exposed upper surface area of the base region.

2. A bipolar transistor structure as in claim 1, and wherein the first layer of dielectric material comprises:
   a layer of silicon dioxide formed on the upper surface of the base region; and
   a first layer of silicon nitride formed on the layer of silicon dioxide.

3. A bipolar transistor structure as in claim 2, and wherein the second layer of dielectric material comprises a layer of TEOS formed on the first layer of silicon nitride.

4. A bipolar transistor structure as in claim 1, and wherein the first conductivity is N-type, and wherein the doped silicate glass comprises phosphosilicate glass (PSG).

5. A bipolar transistor structure as in claim 4, and wherein the dopant concentration of the PSG is about 3-10 wt % phosphorous.

6. A bipolar transistor structure as in claim 4, and wherein the dopant concentration of the PSG is about 6 wt % phosphorous.

7. A bipolar transistor structure as in claim 1, and wherein the conductive emitter comprises polysilicon.

8. A bipolar transistor structure as in claim 1, and wherein the semiconductor substrate comprises SiGe.

9. A method of forming a bipolar transistor structure, the bipolar transistor structure including a collector region having a first conductivity type and formed in a semiconductor substrate, a base region formed on the collector region and having a second conductivity type that is opposite the first conductivity type, and a first layer of dielectric material formed on the base region and having a first emitter window opening formed therein, the first emitter window opening defining sidewalls of the first layer of dielectric material that extend from an upper surface of the first layer of dielectric material to an upper surface of the base region to expose an upper surface area of the base region, the method comprising:
   forming a second layer of dielectric material over the first layer of dielectric material;
   forming a second emitter window opening in the second layer of dielectric material, the second emitter window opening being aligned with the first emitter window opening and defining sidewalls of the second layer of dielectric material that extend from an upper surface of the second layer of dielectric material to an upper surface of the first layer of dielectric material to expose a perimeter surface area of the first layer of dielectric material that extends around the perimeter of the first emitter window opening;
   forming a doped silicate glass layer on the second layer of dielectric material and extending into the first and second emitter window openings;
   removing doped silicate glass from the first and second emitter window openings to define silicate glass spacers on the sidewalls of the second layer of dielectric material and on the perimeter surface area of the first layer of dielectric material and extending to a perimeter edge of the first emitter window opening; and
   forming a conductive emitter having the first conductivity type and that extends into the first ands second emitter window openings and into contact with the doped silicate glass spacers, the sidewalls of the first layer of dielectric material and the exposed upper surface area of the base region.

10. A method as in claim 9, performing a thermal step that causes dopant to diffuse from the doped silicate glass spacers into the conductive emitter.

11. A method as in claim 9, and wherein the first layer of dielectric material comprises:
   a layer of silicon dioxide formed on the upper surface of the base region; and
   a first layer of silicon nitride formed on the layer of silicon dioxide.

12. A method as in claim 11, and wherein the second layer of dielectric material comprises a layer of TEOS formed on the first layer of silicon nitride and a second layer of silicon nitride formed on the layer of TEOS, the method further comprising:
  removing the second layer of silicon nitride prior to the step of forming the conductive emitter.
13. A method as in claim 9, and further comprising:
temperature annealing the doped silicate glass spacers such that dopant diffuses from the doped silicate glass spacers into the conductive emitter.
14. A method as in claim 13, and wherein the conductive emitter comprises polysilicon.

15. A method as in claim 14, and wherein the first conductivity type is N-type, and wherein the silicate glass layer comprises phosphosilicate glass (PSG).
16. A method as in claim 15, and wherein the dopant concentration of the PSG is about 3-10 wt % phosphorous.
17. A method as in claim 13, and wherein the temperature annealing step is performed at 900° C. or greater.
18. A method as in claim 16, and wherein the dopant concentration of the PSG is about 6 wt % phosphorous.

* * * * *